United States Patent [19]
Akimoto et al.

[11] Patent Number: 5,364,222
[45] Date of Patent: Nov. 15, 1994

[54] APPARATUS FOR PROCESSING WAFER-SHAPED SUBSTRATES

[75] Inventors: Masami Akimoto; Kazutoshi Yoshioka; Naruaki Iida, all of Kumamoto, Japan

[73] Assignees: Tokyo Electron Limited, Tokyo; Tokyo Electron Kyushu Limited, Kumamoto, both of Japan

[21] Appl. No.: 14,161

[22] Filed: Feb. 5, 1993

[30] Foreign Application Priority Data

Feb. 5, 1992 [JP] Japan .................................. 4-047738

[51] Int. Cl.⁵ ............................................. B65G 1/00
[52] U.S. Cl. ................................... 414/416; 414/937; 414/941; 414/225; 414/627; 414/744.3; 414/752; 901/46
[58] Field of Search ............... 414/217, 222, 225, 226, 414/618, 619, 331, 627, 935, 937, 749, 939, 940, 941, 744.7, 626, 744.2, 744.3, 273, 751, 752, 753; 118/719; 204/298.25; 901/46, 47

[56] References Cited

U.S. PATENT DOCUMENTS

| | | | |
|---|---|---|---|
| 4,465,416 | 8/1984 | Burkhalter et al. | 414/941 X |
| 4,846,623 | 7/1989 | Otani et al. | 414/933 X |
| 4,985,722 | 1/1991 | Ushijima et al. | . |
| 5,083,896 | 1/1992 | Uehara et al. | 414/933 X |
| 5,133,635 | 7/1992 | Malin et al. | 414/941 X |
| 5,183,370 | 2/1993 | Cruz | 414/937 X |
| 5,217,340 | 6/1993 | Harada et al. | 414/941 X |

FOREIGN PATENT DOCUMENTS

| | | | |
|---|---|---|---|
| 139341 | 6/1987 | Japan | 414/937 |
| 64231 | 3/1989 | Japan | 414/939 |
| 305533 | 12/1989 | Japan | 414/941 |
| 2-196414 | 8/1990 | Japan | . |
| 271643 | 11/1990 | Japan | 414/937 |
| 34345 | 2/1991 | Japan | 414/935 |
| 468409 | 1/1992 | WIPO | 414/937 |

*Primary Examiner*—Frank E. Werner
*Attorney, Agent, or Firm*—Oblon, Spivak, McClelland, Maier & Neustadt

[57] ABSTRACT

An apparatus for coating and developing a resist on a wafer comprises a carrier station provided with a plurality of carriers for receiving wafers and transfer tables, a processing section having a plurality of processing units, and a transfer robot provided between the carrier station and the processing section. The robot comprises a plate-shaped arm for transferring wafers between the carriers and the transfer tables, and two horseshoe-shaped forks for transferring wafers between the processing units and transfer tables. The robot is movable along a transfer path so as to make the arm and forks face the carriers, processing units and transfer tables.

21 Claims, 7 Drawing Sheets

APPARATUS FOR PROCESSING WAFER-SHAPED SUBSTRATES

BACKGROUND OF THE INVENTION

1. Field of the Invention

The present invention relates to an apparatus for processing wafer-shaped substrates.

2. Description of the Related Art

In a process of manufacturing semiconductor wafers, a number of processing units are required. Thus, the space of a factory must be effectively used by reducing the sizes of the processing section and loading/unloading section for semiconductor wafers. In addition, in order to increase the throughput, it is necessary to efficiently transfer semiconductor wafers.

From this point of view, the inventors previously proposed an apparatus for coating and/or developing a photoresist on a semiconductor wafer, as a processing apparatus of the above type (see U.S. Pat. No. 4,985,722).

According to this coating/developing apparatus of this U.S. patent, however, transfer members are provided individually for the loading/unloading section and processing section. Consequently, the structure of the apparatus is complex, the size of the apparatus is large and the space for installation is not effectively used. Moreover, since wafers need to be transferred between the loading/unloading section and the processing section, the throughput decreases.

SUMMARY OF THE INVENTION

The present invention has been devised in consideration of the above circumstances, and its object is to provide a processing apparatus whose size is decreased to effectively use the space for installation and whose throughput is increased.

According to a first aspect of the invention, there is provided an apparatus for processing a wafer-shaped substrate, comprising:

(a) a container for containing a substrate;

(b) a processing unit for processing the substrate;

(c) a transfer table for transferring the substrate; and (d) a transfer robot for transferring the substrate, the robot including a first handler for transferring the substrate between the container and the transfer table, the first handler being able to advance and retreat in a horizontal direction, and the first handler having a such a width that the first handler can advance into the container, a second handler for transferring the substrate between the processing unit and the transfer table, the second handler being able to advance and retreat in a horizontal direction, and the second handler being designed such that the second handler holds the substrate with the bottom surface of the substrate being substantially exposed, and a robot body for supporting the first and second handlers, the robot body being movable such that the first and second handlers face the container, the processing unit and the transfer table.

According to a second aspect of the invention, there is provided an apparatus for processing a wafer-shaped substrate, comprising:

(a) a container for containing a substrate;

(b) a processing unit for processing the substrate; and (c) a transfer robot for transferring the substrate, the robot including a first handler for transferring the substrate into and from the container, the first handler being able to advance and retreat in a horizontal direction, and the first handler having a such a width that the first handler can advance into the container, a second handler for transferring the substrate into and from the processing unit, the second handler being able to advance and retreat in a horizontal direction, the second handler being designed such that the second handler holds the substrate with the bottom surface of the substrate being substantially exposed, and the second handler having an opening through which to pass the first handler vertically, a robot body for supporting the first and second handlers, the robot body being movable such that the first and second handlers face the container, the processing unit and the transfer table, and vertical movement means for vertically moving the first and second handlers relative to each other between a first position at which the first handler is situated above the second handler and a second position at which the second handler is situated above the first handler, the first and second handlers being vertically moved relative to each other, thereby transferring the substrate between the first and second handlers.

The carrier station and the processing section may be situated in an opposed arrangement, an in-line arrangement, or a combination of opposed arrangement and in-line arrangement.

According to the apparatus of the first aspect of the invention, all substrates can be transferred by a single transfer robot. Thus, the size of the apparatus can be reduced, the space for installation can be effectively used, and the throughput can be increased.

According to the apparatus of the second aspect of the invention, substrates can be transferred between the first and second handlers by the transfer robot itself. Thus, the transfer table can be omitted, the space for installation can be effectively used, and the throughput can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An apparatus for coating/developing a resist on a wafer, according to embodiments of the present invention, will now be described.

Figure 1:
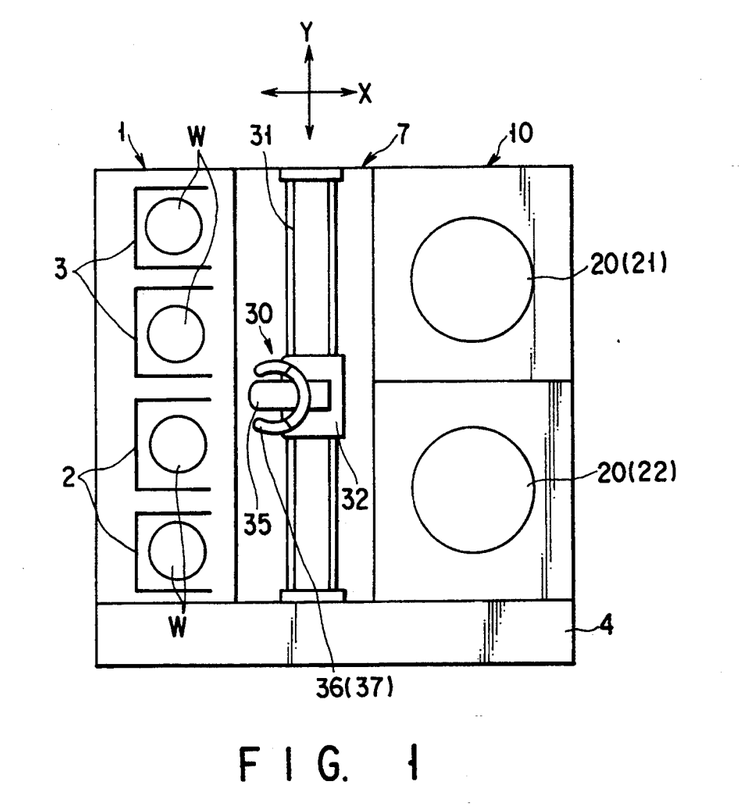
FIG. 1 is a schematic plan view showing a coating/developing apparatus according to an embodiment of the present invention.

The apparatus shown in FIG. 1 has a carrier station 1 provided with wafer carriers 2 and 3 for receiving semiconductor wafers w, or objects to be processed. The apparatus also has a processing section 10 having two processing units 20 for processing wafers W, i.e. a resist liquid coating unit 21 and a developing liquid coating unit 22. The carrier station 1 and processing section 10 face each other, and a transfer section 7 is interposed therebetween. An operation section 4 is provided on the side of these sections 1, 7 and 10.

Figure 2:
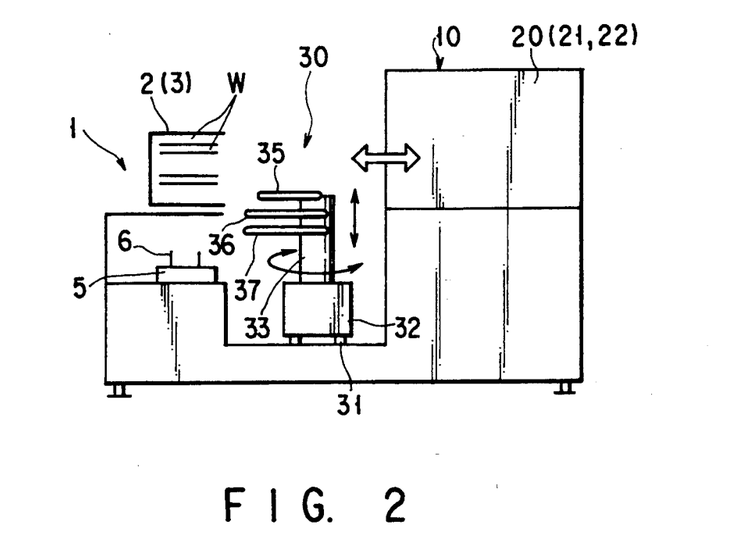
FIG. 2 is a schematic side view of the apparatus shown in FIG. 1.

The carrier station 1 is provided with two wafer carrier 2 for receiving non-processed wafers W and two wafer carriers 3 for receiving processed wafers w. As is shown in FIG. 2, four transfer tables 5 are situated just under the corresponding carriers 2 and 3. Each table 5 is provided with fixed wafer support pins 6. The support pins 6 are situated so as not to interfere with an arm 35 and forks 36 and 37 of a robot 30 (described later) and the pins 6 receive the wafers W from the arm 35 and forks 36 and 37.

The transfer section 7 comprises the robot 30 which is movable along a transfer path 31 provided between the carrier station 1 and processing section 10. The robot 30 comprises a carriage table 32. The table 32 is driven by a ball-screw mechanism (not shown) and it is moved along the transfer path 31. A shaft 33 stands on the upper surface of the carriage table 32. The shaft 33 can be moved vertically and rotated horizontally by a ball-screw mechanism or a stepping motor built in the carriage table 32.

Figure 3:
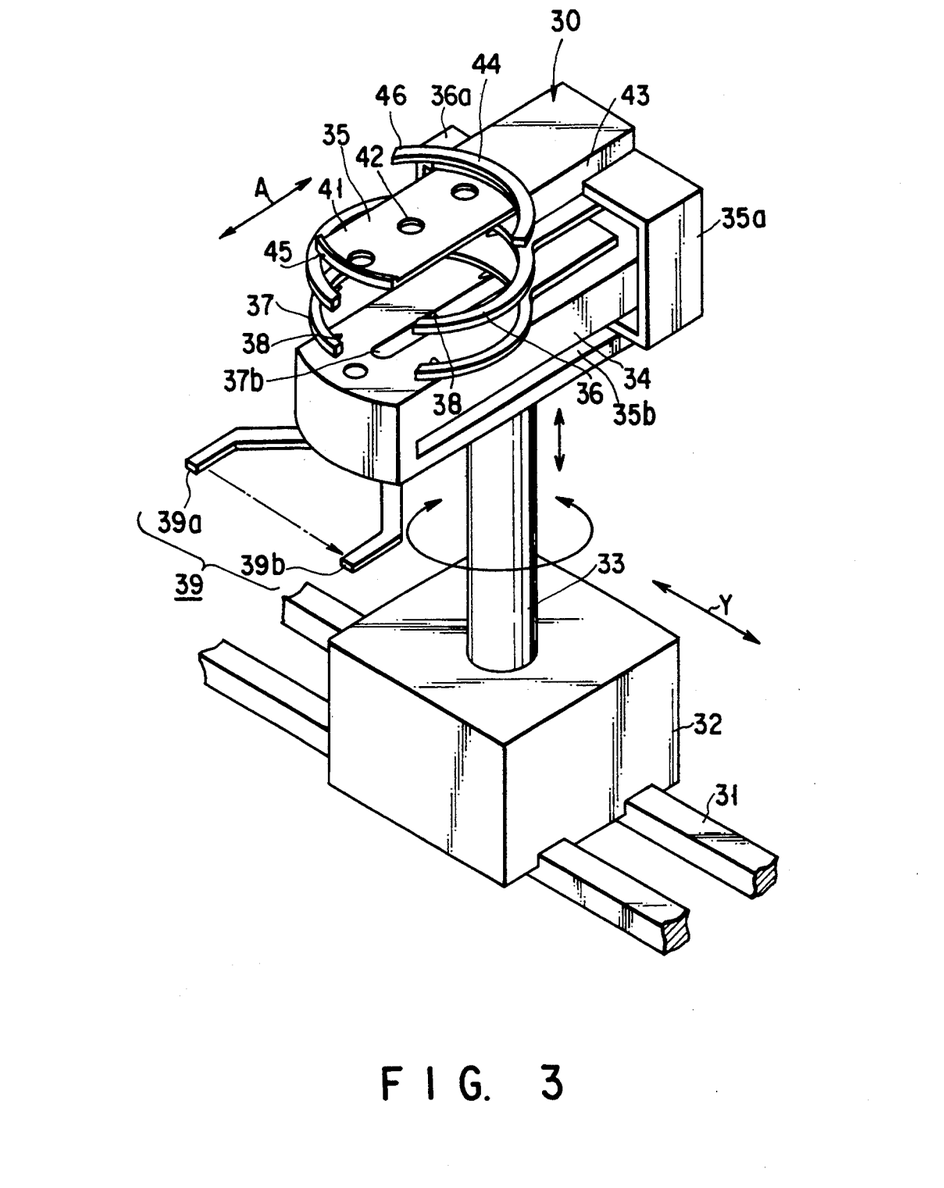
FIG. 3 is a perspective view showing in detail a transfer robot according to the present invention.
Figure 4:
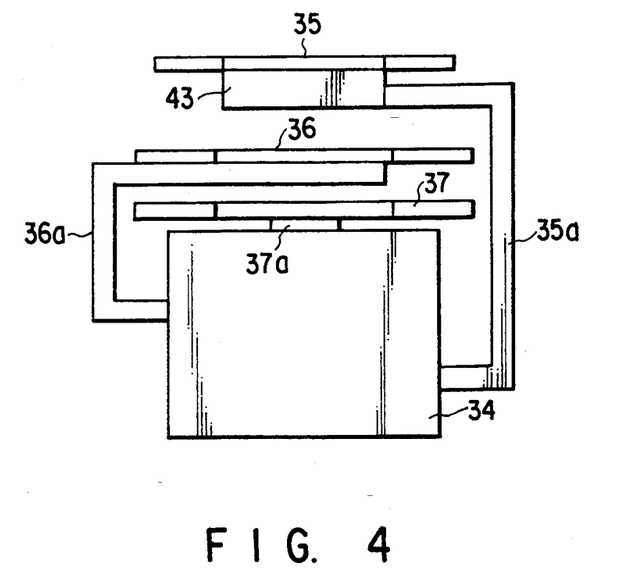
FIG. 4 is a schematic front view showing the positional relationship between an arm and forks of the robot shown in FIG. 3.

A driving block 34 is fixed on the top portion of the shaft 33. The block 34 is provided with an arm 35 and two forks 36 and 37. As is schematically shown in FIG. 4, the arm 35 and forks 36 and 37 are coupled to driving means in the block 34 via associated support frames 35a, 36a and 37a. Thus, the arm 35 and forks 36 and 37 are independently movable in a horizontal direction (indicated by arrow A in FIG. 3). A portion of the support frame 35a for the arm 35 is put in the block 34 through an elongated opening 35b (see FIG. 3) formed in a lower portion of the right side plate (in FIG. 4) of the block 34. A portion of the support frame 36a of the fork 36 is put in the block 34 through an elongated opening (not shown) formed at a substantially center portion of the left side plate (in FIG. 4) of the block 34. A portion of the support frame 37a of the fork 37 is put in the block 34 through an elongated opening 37b (see FIG. 3) formed in the top plate of the block 34.

The arm 35 is used to load/unload wafers on/from the carriers 2 and 3. Thus, the width of a rectangular plate 41, which is a main part of the arm 35, is determined so that the plate 41 can be inserted in the carrier 2, 3. Three suction holes 42 connected to a vacuum mechanism are formed in the plate 41, thereby drawing and holding wafers. The plate 41 can be moved relative to a rear alignment frame 44 by a driving unit 43 provided at a rear part of the arm 35. Accordingly, when the plate 41 receives a wafer, the plate 41 is moved backward so that the wafer is clamped and aligned between a forward projection 45 of the plate 41 and the alignment frame 44. In addition, a wafer position sensor 46 of, e.g. photoelectric type is provided on the alignment frame 44 of the arm 35.

The forks 36 and 37 are used to load/unload wafers on/from the processing units 20 (21, 22). In order to prevent thermal cross-contamination, each fork 36, 37 is formed in a horseshoe shape, with an opened front portion. Each fork 36, 37 has three claws 38 projecting from its inner peripheral surface at predetermined intervals. A lower edge portion of the wafer is held by the claws 38.

A mapping sensor 39 for sensing the presence/absence of wafers in the carriers 2 and 3 is attached at a front portion of the driving block 34. The sensor 39 is constituted by a photosensor comprising a light-emitting portion 39a and a light-receiving portion 39b. Like the arm 35 and forks 36 and 37, the sensor 39 is connected to driving means in the block 34 and it is movable horizontally (in the direction of arrow A in FIG. 3). Thus, the sensor 39 can enter the wafer carrier 2, 3 from the state in which it faces the carrier 2, 3.

The operation of the above coating/developing apparatus will be described.

First, the robot 30 moves along the transfer path 31 to the position in front of the wafer carrier 2. The arm 35 is moved vertically and also moved forward and backward by the driving mechanisms in the carriage table 32 and block 34, thereby taking out a non-processed wafer W from the carrier 2. The arm 35 holding the wafer W is moved to the transfer table 5 below the carrier 2, and the arm 35 loads the wafer W on the table 5.

Next, the fork 36 or 37 is moved and holds the wafer W on the table 5. Subsequently, the robot 30 is moved to the processing unit 20 (i.e. the resist liquid coating unit 21 or developing liquid coating unit 22). The fork 36, 37 is moved vertically and moved forward and backward by the driving mechanisms in the carriage table 32 and block 34, thereby transferring the wafer W to the processing unit 20.

In the same manner, the arm 35 takes up another (second) non-processed wafer W and loads it on the transfer table 5. The fork 36, 37 receives the wafer W from the table 5 and waits at the position facing the processing unit 20. When the first wafer W has been processed in the processing unit 20, the fork 36 or 37 which does not hold the non-processed wafer w enters the processing unit 20 and holds the processed wafer w. Then, the second wafer W is loaded in the processing unit 20 by the other fork.

The processed wafer W taken out from the processing unit 20 is placed on the transfer table 5 below the carrier 3. The arm 35 receives the wafer W from the table 5 and transfers it to the carrier 3.

The above operation is repeated, and non-processed wafers W in the carrier 2 are processed in the processing unit 20 (21, 22) and then placed in the wafer carrier 3. Thus, the wafer processing is completed.

Figure 5:
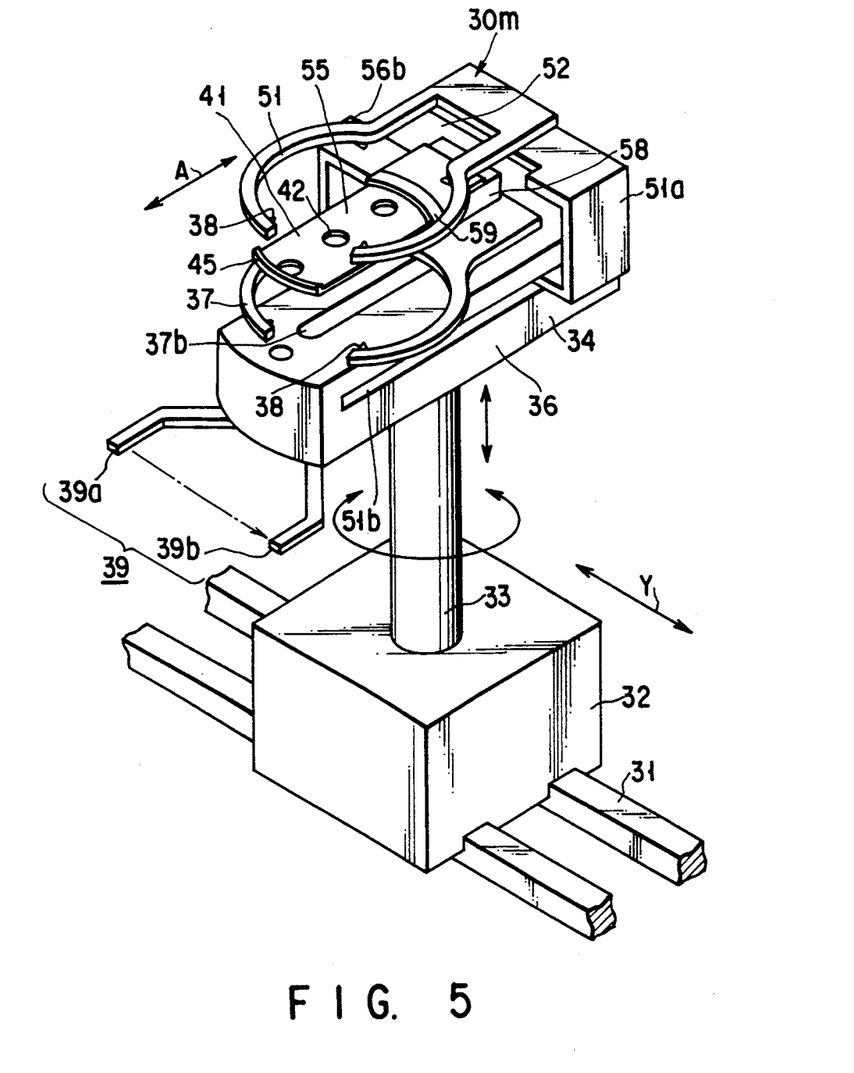
FIG. 5 is a perspective view showing in detail a modification of the transfer robot according to the invention.
Figure 6:
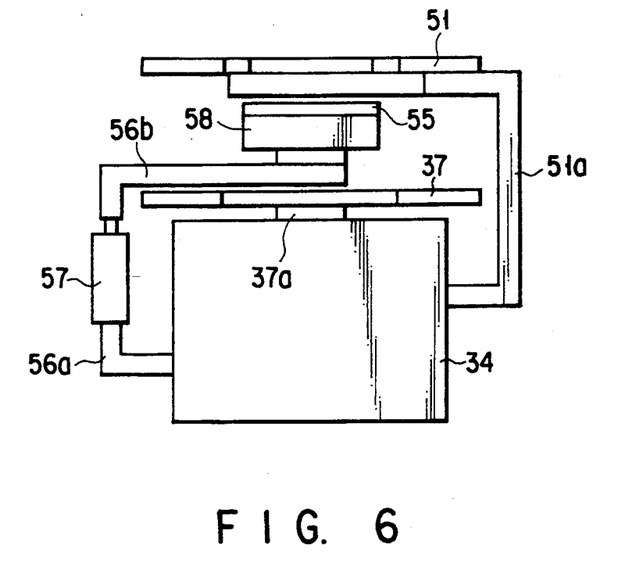
FIG. 6 is a schematic front view showing the positional relationship between an arm and forks of the robot shown in FIG. 5.

FIGS. 5 and 6 show a modification of the transfer robot. A robot 30m can transfer a wafer between the arm and fork, without using the transfer table 5. In FIGS. 5 and 6, the parts common to those shown in FIGS. 3 and 4 are denoted by like reference numerals and a description thereof is omitted.

In this modification, an arm 55 and forks 37 and 51 are connected to driving means in the block 34 via associated support frames, in the same manner with the arm and forks shown in FIGS. 3 and 4. The arm 55 and forks 37, 51 are independently movable horizontally (in the direction of arrow A in FIG. 5).

The lower fork 37 is the same as is employed in the preceding embodiment, but the upper fork 51 differs from the fork 36 in some respects. A portion of a support frame 51a of the fork 51 is put in the block 34 through an elongated opening 51b (see FIG. 5) formed at a substantially center portion of the right side plate (in FIG. 6) of the block 34. A large notch 52 continuous with a center opening is formed at a proximal portion of the fork 51. The frame 51a is also provided with a notch matching with the notch 52. Since the notch 52 is provided, the fork 51 is provided with four claws 38 at four locations for supporting a wafer.

The arm 55 is connected to a left side portion (in FIG. 6) of the block 34 via support frames 56a and 56b including an extension actuator 57. The length and width of the arm 55 are determined such that the arm 55 can pass through the center opening and notch 52 of the fork 51. Similarly, the length of a rear alignment frame 59 is set to be substantially equal to the width of the plate 41. By this structure, the arm 55 can be moved by the actuator 57 between the upper position, at which the arm 55 projects upward from the fork 51, and the lower position at which the arm 55 is situated between the forks 51 and 37.

Like the arm 35, the plate 41 of the arm 55 can be moved relative to the alignment frame 59 by a driving unit 58. Thus, the wafer can be clamped and aligned between a front projection 45 of the plate 41 and the alignment frame 59.

In the robot 30m of this modification, the arm 55 receives the wafer W in the state in which the arm 55 is situated at the upper position and then the arm 55 is lowered by the actuator 57. Thus, the wafer w is transferred from the arm 55 on the fork 51.

On the other hand, the fork 51 receives the wafer W in the state in which the arm 55 is situated at the lower position and then the arm 55 is raised by the actuator 57. Thus, the wafer W can be transferred from the fork 51 to the arm 55.

Accordingly, the transfer table 5 is not required, and the space for installing the processing apparatus can be effectively used and the throughput can be enhanced.

Unlike the robot 30m, the fork 51 can be made to be vertically movable. Further, both the fork 51 and arm 55 can be made to be vertically movable. Furthermore, the support frame of the lower fork 37 may be provided on the side portion of the block 34 and the fork 37 may be provided with a notch similar to that of the fork 51. Thereby, the arm 55 can be made to vertically movable through both forks 37 and 51.

Figure 7:
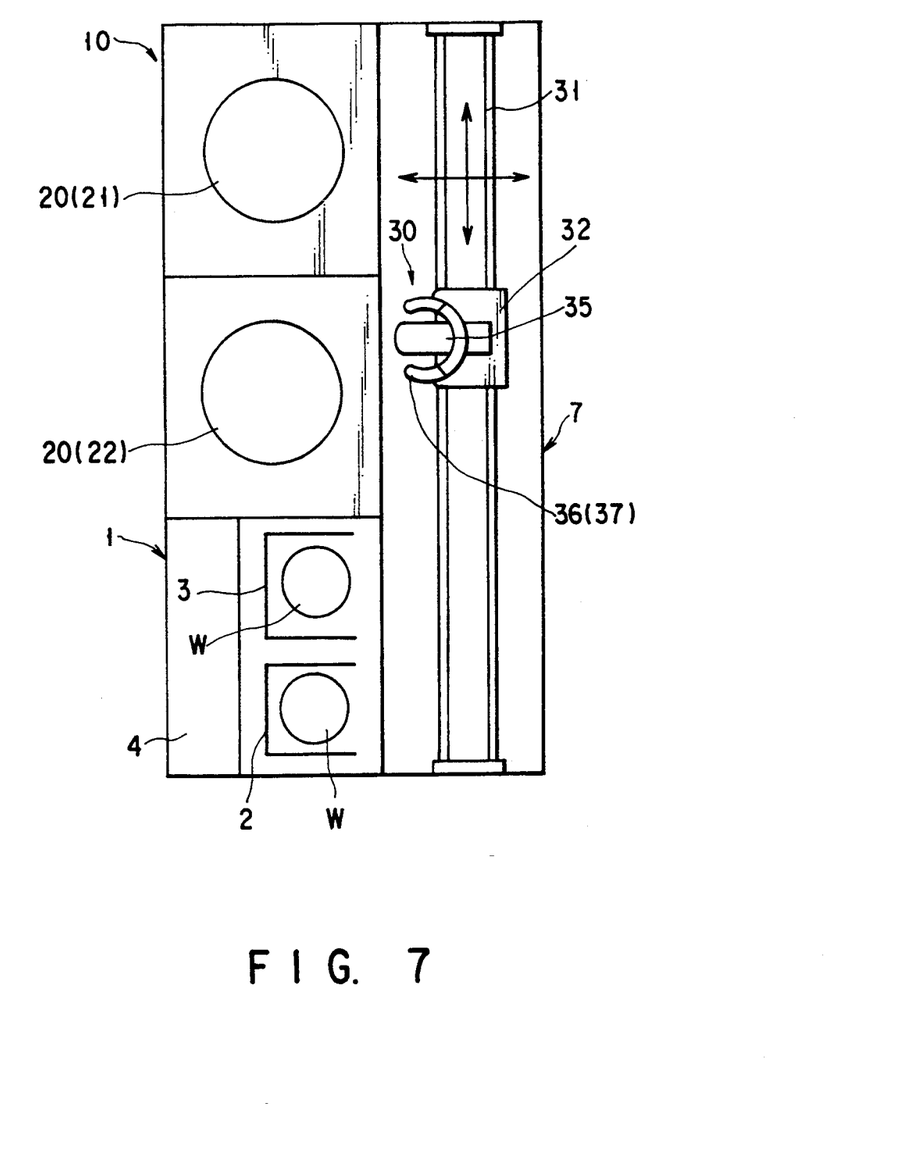
FIG. 7 is a schematic plan view showing a coating-/developing apparatus according to another embodiment of the present invention.
Figure 8:
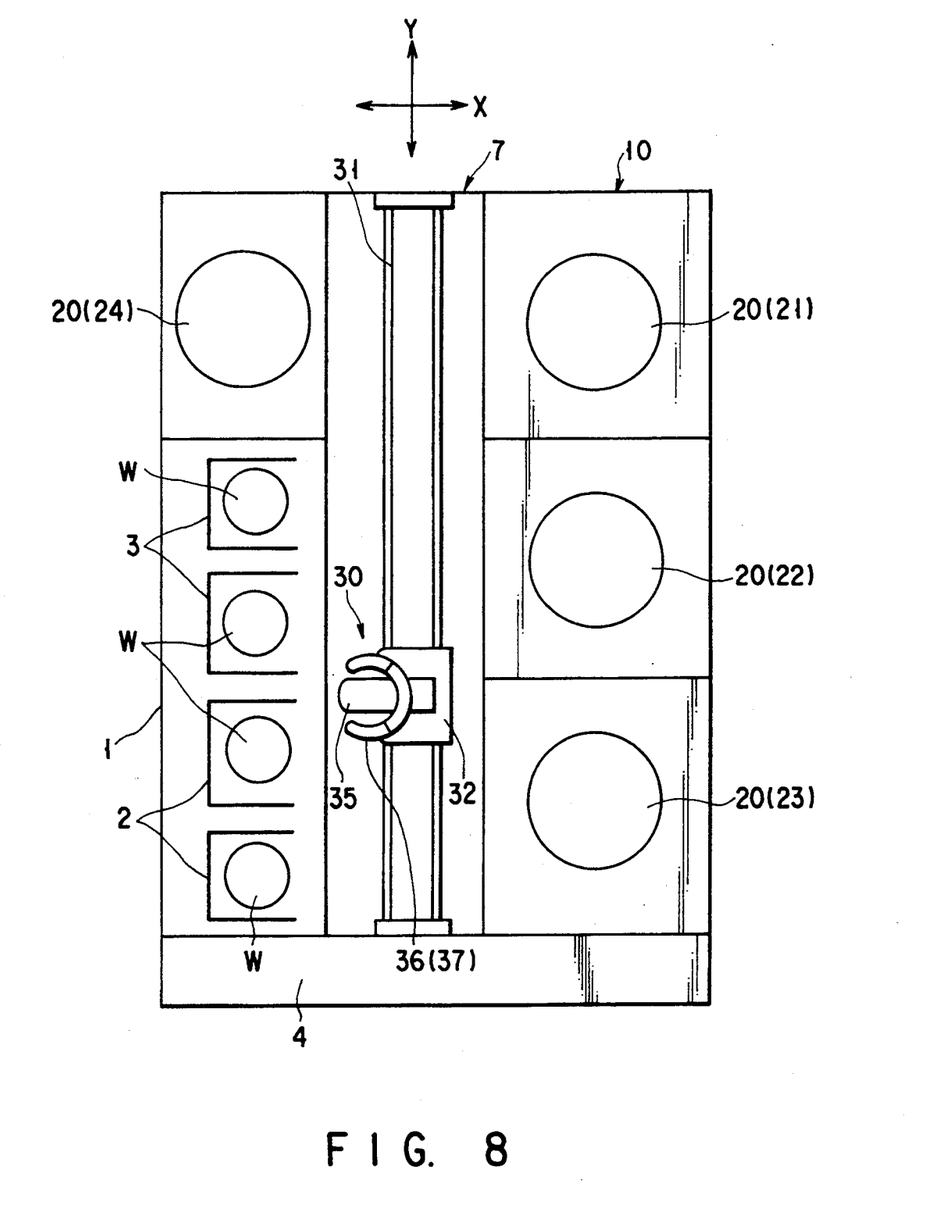
FIG. 8 is a schematic plan view showing a coating-/developing apparatus according to still another embodiment of the present invention.
Figure 9:
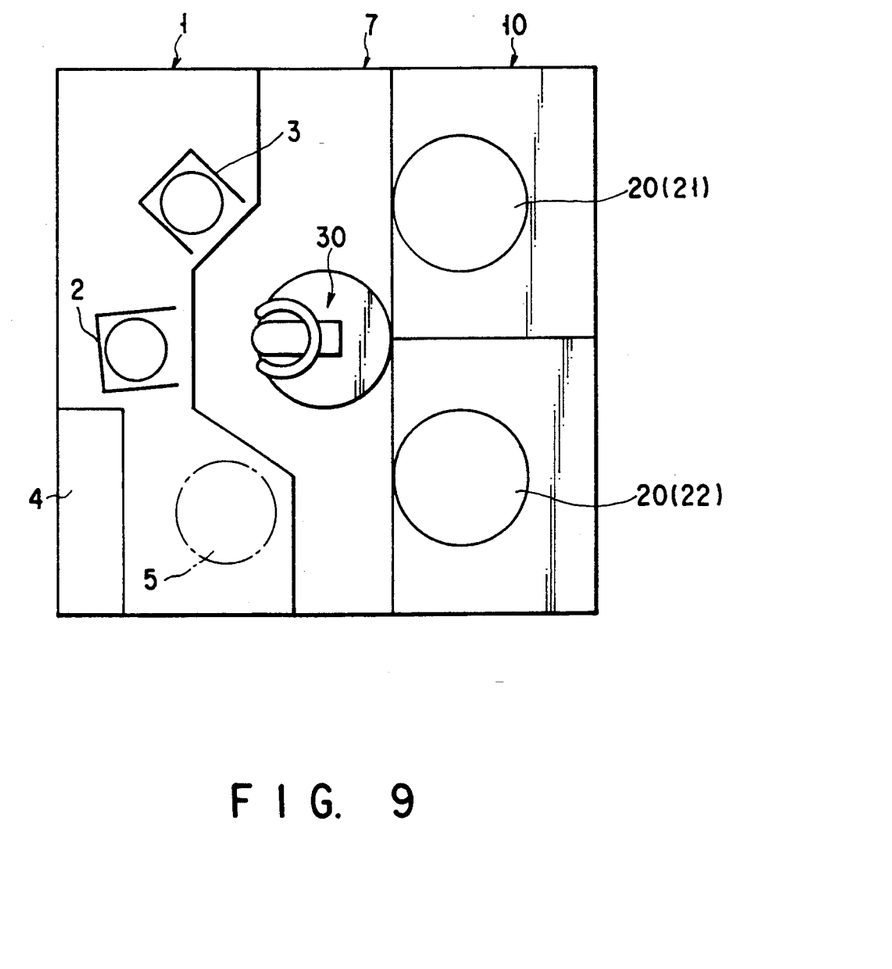
FIG. 9 is a schematic plan view showing a coating-/developing apparatus according to still another embodiment of the present invention.

FIGS. 7 to 9 show a modification of arrangement of the carrier station 1, processing section 10 and transfer section 7. In FIGS. 7 to 9, the parts common to those of the embodiment of FIG. 1 are denoted by the same reference numerals, and description thereof is omitted.

In FIG. 7, the carrier station 1 and processing section 10 are arranged along the same line. The transfer path 31 of the transfer section 7 is parallel to the line of the carrier station 1 and processing section 10. The transfer tables 5 are situated below the carriers 2 and 3, as shown in FIG. 2. By this arrangement, the transfer robot 30 does not need to rotate horizontally ($\theta$-directional movement). Thus, the structure of the transfer section 7 is simplified, and the throughput is increased.

Referring to FIG. 8, the processing section 10 comprises units 21 to 23, which are opposed to the carrier station 1 with the transfer section 7 interposed therebetween, and a unit 24 situated in line with the carrier station 1. The transfer tables 5 are situated below the carriers 2 and 3, as shown in FIG. 2. By this arrangement, the apparatus can comprise many units 20, e.g. a plurality of units 21, 22 and 23 for coating a resist liquid or a developing liquid and the heat treatment unit 24.

In FIG. 9, the carriers 2 and 3 of the carrier station 1 and the processing units 21 and 22 of the processing section 10 are arranged along the rotational orbit of the transfer robot 30. The transfer tables 5 are situated below the carriers 2 and 3, as shown in FIG. 2. As indicated by a dot-and-dash line in FIG. 9, the transfer table 5 may be situated along the rotational orbit and at the same height as the carriers 2 and 3. According to the arrangement shown in FIG. 9, the transfer path of the transfer section 7 can be omitted, and the structure of the transfer section 7 can be simplified. In addition, the throughput can be increased.

FIGS. 7 to 9 show the case where the transfer robot 30 shown in FIGS. 3 and 4 is used. However, the transfer robot 30m shown in FIGS. 5 and 6 may be used instead. In this case, the transfer table 5 may be omitted, as stated above.

In the above description, the present invention is applied to the coating/developing apparatus for semiconductor wafers. However, this invention is applicable to processing apparatuses other than the coating-/developing apparatus. In addition, this invention is applicable to apparatuses for processing wafer-shaped objects, other than semiconductor wafers, such as LCD substrates, printed boards, photo marks, etc.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for processing a wafer-shaped substrate, comprising:
   (a) a section arranged in the apparatus, for placing a container containing the substrate;
   (b) a processing unit arranged in the apparatus for processing the substrate;
   (c) a transfer station arranged in the apparatus for transferring the substrate; and
   (d) a transfer robot arranged in the apparatus for transferring the substrate, the robot including a first handler for transferring the substrate between the container and the transfer station, the first handler being able to advance and retreat in a horizontal direction, and the first handler having such a width that the first handler can advance into the container, a second handler for transferring the substrate between the processing unit and the transfer station, the second handler being able to advance and retreat in a horizontal direction, and the second handler being designed such that the second handler holds the substrate with a bottom surface of the substrate being substantially exposed, and a robot body for supporting and driving the first and second handlers to advance and retreat in horizontal directions, the robot body being movable such that the first and second handlers face the container, the processing unit and the transfer station.

2. The apparatus according to claim 1, wherein the transfer station has a plurality of support pins for supporting the substrate, and the support pins are arranged so as not to interfere with the first and second handlers.

3. The apparatus according to claim 2, wherein the robot body comprises a base, a shaft provided on the base rotatably and vertically movably, and a driving block provided on an upper portion of the shaft, and the first and second handlers are supported and driven by the driving block to advance and retreat in horizontal directions.

4. The apparatus according to claim 3, wherein a linear transfer path is formed along the container and the processing unit, and the base is movable along the transfer path.

5. The apparatus according to claim 3, wherein the container and the processing unit are arranged along a rotational orbit of the driving block.

6. The apparatus according to claim 3, wherein the driving block is provided with a sensor for sensing presence/absence of the wafer in the container.

7. The apparatus according to claim 3, further comprising a third handler for transferring the substrate between the processing unit and the transfer station, the third handler being supported and driven by the driving block to advance and retreat in a horizontal direction, and the third handler being designed such that the third handler holds the substrate with the bottom surface of the substrate being substantially exposed.

8. The apparatus according to claim 2, wherein the first handler includes a plate for supporting the substrate, and the plate is provided with vacuum suction means for fixing the substrate.

9. The apparatus according to claim 8, wherein the first handler includes a rear alignment frame and means for moving the plate relative to the rear alignment frame, and a projection is formed at an end portion of the plate, the plate being moved relative to the alignment frame thereby clamping and aligning the substrate between the projection and the alignment frame.

10. The apparatus according to claim 2, wherein the second handler includes a horseshoe-shaped frame with a notch at a front portion thereof, and a plurality of support claws formed on the horseshoe-shaped frame.

11. An apparatus for processing a wafer-shaped substrate, comprising:

(a) a section arranged in the apparatus, for placing a container containing the substrate;

(b) a processing unit arranged in the apparatus for processing the substrate; and (c) a transfer robot arranged in the apparatus for transferring the substrate, the robot including a first handler for transferring the substrate into and from the container, the first handler being able to advance and retreat in a horizontal direction, and the first handler having such a width that the first handler can advance into the container, a second handler for transferring the substrate into and from the processing unit, the second handler being able to advance and retreat in a horizontal direction, the second handler being designed such that the second handler holds the substrate with a bottom surface of the substrate being substantially exposed, and the second handler having an opening through which to pass the first handler vertically, a robot body for supporting and driving the first and second handlers to advance and retreat in horizontal directions, the robot body being movable such that the first and second handler face the container and the processing unit, and vertical movement means for vertically moving the first and second handlers relative to each other between a first position at which the first handler is situated above the second handler and a second position at which the second handler is situated above the first handler, the first and second handlers being vertically moved relative to each other, thereby transferring the substrate between the first and second handlers.

12. The apparatus according to claim 11, wherein the robot body comprises a base, a shaft provided on the base rotatably and vertically movably, and a driving block provided on an upper portion of the shaft, and the first and second handlers are supported and driven by the driving block to advance and retreat in horizontal directions.

13. The apparatus according to claim 12, wherein a linear transfer path is formed along the container and the processing unit, and the base is movable along the transfer path.

14. The apparatus according to claim 12, wherein the container and the processing unit are arranged along a rotational orbit of the driving block.

15. The apparatus according to claim 12, wherein the driving block is provided with a sensor for sensing presence/absence of the wafer in the container.

16. The apparatus according to claim 12, further comprising a third handler for transferring the substrate into and from the processing unit, the third handler being supported and driven by the driving block to advance and retreat in a horizontal direction, and the third handler being designed such that the third handler holds the substrate with the bottom surface of the substrate being substantially exposed.

17. The apparatus according to claim 11, wherein the first handler includes a plate for supporting the substrate, and the plate is provided with vacuum suction means for fixing the substrate.

18. The apparatus according to claim 17, wherein the first handler includes a rear alignment frame and means for moving the plate relative to the rear alignment frame, and a projection is formed at an end portion of the plate, the plate being moved relative to the alignment frame thereby clamping and aligning the substrate between the projection and the alignment frame.

19. The apparatus according to claim 11, wherein the second handler includes a horseshoe-shaped frame with a notch at a front portion thereof, and a plurality of support claws formed on the horseshoe-shaped frame.

20. An apparatus for processing a wafer-shaped substrate, comprising:

(a) a section arranged in the apparatus, for placing a container containing the substrate;

(b) a processing unit arranged in the apparatus, for processing the substrate;

(c) a transfer robot arranged in the apparatus, for transferring the substrate, the robot including a first handler for transferring the substrate into and from the container, the first handler being able to advance and retreat in a horizontal direction, and the first handler having such a width that the first handler can advance in to the container, a second handler for transferring the substrate into and from the processing unit, the second handler being able to advance and retreat in a horizontal direction, and the second handler being designed such that the second handler holds the substrate with a bottom surface of the substrate being substantially exposed, and a robot body support and driving the first and second handlers to advance and retreat in horizontal directions, the robot body being movable such that the first and second handlers face the container and the processing unit; and (d) means for transferring the substrate between the first and second handler.

21. The apparatus according to claim 20, wherein the robot body comprises a body, a shaft provided on the base rotatably and vertically movably, and a driving block provided on an upper portion of the shaft, and the first and second handlers are supported and driven by the driving block to advance and retreat in horizontal directions.

* * * * *